US009264219B1

(12) United States Patent
Kang et al.

(10) Patent No.: US 9,264,219 B1
(45) Date of Patent: Feb. 16, 2016

(54) CLOCK AND DATA RECOVERY CIRCUIT AND METHOD

(71) Applicants: GLOBAL UNICHIP CORPORATION, Hsinchu City (TW); TAIWAN SEMICONDUCTOR MANUFACTURING CO., LTD., Hsinchu (TW)

(72) Inventors: Wen-Juh Kang, Tainan (TW); Yen-Chung Chen, Hsinchu (TW); Liang-Hung Chen, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/819,421

(22) Filed: Aug. 5, 2015

(30) Foreign Application Priority Data

Oct. 15, 2014 (TW) .............................. 103135666 A (51) Int. Cl.
| | |
|---|---|
| *H04L 7/00* | (2006.01) |
| *H04L 25/00* | (2006.01) |
| *H04L 7/04* | (2006.01) |
| *H03L 7/06* | (2006.01) |
| *H03L 7/091* | (2006.01) |

(52) U.S. Cl.
CPC .. *H04L 7/04* (2013.01); *H03L 7/06* (2013.01); *H03L 7/091* (2013.01)

(58) Field of Classification Search
CPC ..... H04L 7/0337; H04L 7/0334; H04L 7/033; H04L 7/0331; H04L 7/0332; H04L 7/091; H04L 7/092; H04L 7/095

USPC .................. 375/354, 355, 371–376; 327/144, 327/146–150, 156–159

See application file for complete search history.

(56) References Cited

U.S. PATENT DOCUMENTS

| | | | | |
|---|---|---|---|---|
| 7,535,957 | B2 * | 5/2009 | Ozawa | ..................... H03L 7/087 348/530 |
| 8,279,992 | B1 | 10/2012 | Li | |
| 2004/0155687 | A1 * | 8/2004 | Lee | ....................... H03K 3/3562 327/165 |
| 2012/0008727 | A1 * | 1/2012 | Mohajeri | .................. H03L 7/06 375/376 |
| 2013/0259178 | A1 | 10/2013 | Bae et al. | |

FOREIGN PATENT DOCUMENTS

TW         I346460         8/2011

\* cited by examiner

*Primary Examiner* — Tesfaldet Bocure
(74) *Attorney, Agent, or Firm* — CKC & Partners Co., Ltd.

(57) ABSTRACT

A clock and data recovery (CDR) circuit and method are disclosed herein. The CDR circuit includes a data analysis module, a loop filter module and a phase adjust module. The data analysis module generates an error signal according to an input data, a first clock signal, and a second clock signal. The loop filter module generates a first corrective signal according to the error signal, a frequency threshold value, and a phase threshold value. The phase adjust module generates the first clock signal and the second clock signal according to the first corrective signal. The loop filter module further accumulates the error signal to generate an accumulated value, and to compare the accumulated value with an accumulated threshold value, so as to dynamically adjust the accumulated threshold value, the frequency threshold value, and the phase threshold value.

20 Claims, 6 Drawing Sheets

CLOCK AND DATA RECOVERY CIRCUIT AND METHOD

This application claims priority to Taiwan Application Serial Number, 103135666, filed Oct. 15, 2014, which is herein incorporated by reference.

BACKGROUND

1. Technical Field

The present disclosure relates to an integrated circuit. More particularly, the present disclosure relates to a clock and data recovery circuit.

2. Description of Related Art

With the rapid development of manufacturing technology, the operating speed of integrated circuits has been significantly improved. In a high speed communication system, a clock and data recovery (CDR) circuit is commonly utilized for assuring that input data can be correctly read after being transferred.

Typically, a CDR circuit has a fixed bandwidth. To process data at a high speed, the bandwidth of the CDR circuit must be high to reduce offset of the input data efficiently. However, if the CDR circuit keeps the same operating speed when the offset of the input data is decreased, more noise from clock jitter may be introduced during the clock and data recovery operation.

Therefore, a heretofore-unaddressed need exists to address the aforementioned deficiencies and inadequacies.

SUMMARY

An aspect of the present disclosure is to provide a clock and data recovery circuit. The clock and data recovery circuit includes a data analysis module, a loop filter module, and a phase adjust module. The data analysis module is configured to generate an error signal according to an input data, a first clock signal, and a second clock signal. The loop filter module is configured to generate a first corrective signal according to the error signal, a phase threshold value, and a frequency threshold value. The phase adjust module is configured to generate the first clock signal and the second clock signal according to the first corrective signal. The loop filter module is further configured to accumulate the error signal to generate an accumulated value, and to compare the accumulated value with an accumulated threshold value to dynamically adjust the accumulated threshold value, the phase threshold value, and the frequency threshold value.

Another aspect of the present disclosure is to provide a clock and data recovery method. The clock and data recovery method includes sampling an input data according to a first clock signal by a data sampler to generate a data signal; sampling the input data according to a second clock signal by an edge sampler to generate an edge signal, in which the first clock signal and the second dock signal are different in phase by 90 degrees; generating an error signal according to the data signal and the edge signal by a phase detector; accumulating the error signal in a predetermined time interval by an accumulator to generate an accumulated value; comparing the accumulated value with an accumulated threshold value to dynamically adjust the accumulated threshold value, a phase threshold value, and a frequency threshold value; generating a corrective signal according to the error signal, the phase threshold value and the frequency threshold value by a loop filter; and adjusting the first clock signal and the second signal according to the corrective signal by a phase adjust module.

In summary, the clock and data recovery circuit and method thereof are able to dynamically adjust parameters of internal circuits according to the offset of the input data. Thus, when the offset of the input data is low, the operating speed of the clock and data recovery circuit is reduced, so that the impact of clock jitter is reduced. Alternatively, when the offset of the input data is increased, the operating speed of the clock and data recovery circuit is immediately increased, and thus the speed of tracking frequency is increased.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Although the terms "first," "second," etc., may be used herein to describe various elements, these elements should not be limited by these terms. These terms are used to distinguish one element from another.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
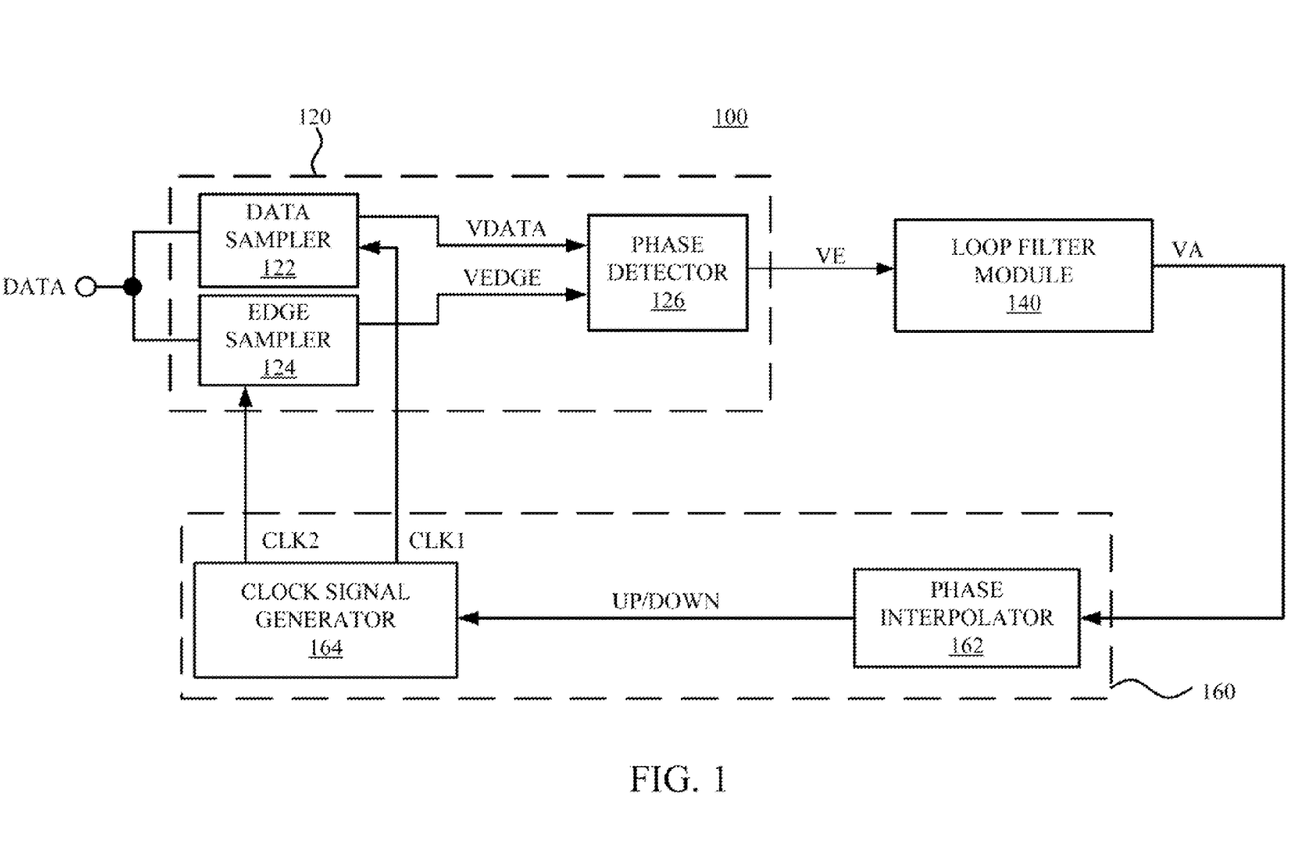
FIG. 1 is a schematic diagram of a clock and data recovery circuit according to one embodiment of the present disclosure.

Reference is made to FIG. 1. FIG. 1 is a schematic diagram of a clock and data recovery circuit 100 according to one embodiment of the present disclosure. As shown in FIG. 1, the clock and data recovery circuit 100 includes a data analysis module 120, a loop filter module 140, and a phase adjust module 160.

The data analysis module 120 is configured to generate an error signal VE according to an input data DATA, a clock signal CLK1, and a clock signal CLK2. In some embodiments, the data analysis module 120 includes a data sampler 122, an edge sampler 124, and a phase detector 126.

The data sampler 122 is configured to sample a data value of the input data DATA according to the clock signal CLK1, so as to generate a data signal VDATA. The edge sampler 124 is configured to sample a rising edge or a falling edge of the input data DATA according to the clock signal CLK2, so as to generate an edge signal VEDGE. The phase detector 126 is electrically coupled to the data sampler 122 and the edge sampler 124 to receive the data signal VDATA and the edge signal VEDGE. In some embodiments, the clock signal CLK1 and the clock signal CLK2 are configured to be different in phase by 90 degrees.

The phase detector 126 is able to detect a phase difference between the data signal VDATA and the edge signal VEDGE, so as to generate the error signal VE. For example, when the input data DATA is shifted during a data transfer process, and the phase of the data signal VDATA is thus different from the phase of the edge signal VEDGE, the phase detector 126 is able to output the error signal VE having a value of 1 or −1. Alternatively, when the phase of the data signal VDATA is same as the phase of the edge signal VEDGE, the phase detector 126 is able to output the error signal VE having the value of 0.

In practical applications, the phase detector 126 can be any type of phase detector. For example, in some embodiments, the phase detector 126 is a bang-bang phase detector. However, such a phase detector type is given for illustrative purposes only, and the present disclosure is not limited thereto. Persons skilled in the art are able to choose other types of phase detectors according to the requirements of practical applications.

The loop filter module 140 is electrically coupled to the data analysis module 120 to receive the error signal VE. The loop filter module 140 is configured to generate a corrective signal VA according to the error signal VE, a phase threshold value MP, and a frequency threshold value MF.

In various embodiments, an accumulated threshold value MACC, the phase threshold value MP, and the frequency threshold value MF can be initially stored in the loop filter module 140, and are able to be adjusted by external programs or circuits.

The phase adjust module 160 is configured to generate the clock signal CLK1 and the clock signal CLK2 according to the corrective signal VA. In greater detail, the phase adjust module 160 includes a phase interpolator 162 and a clock signal generator 164.

The phase interpolator 162 is electrically coupled to the loop filter module 140 to receive the corrective signal VA. The phase interpolator 162 generates at least one corrective signal UP/DOWN according to the corrective signal VA. The clock signal generator 164 is electrically coupled to the phase interpolator 162 to receive the corrective signal UP/DOWN, and adjusts the clock signal CLK1 and the clock signal CLK2 toward a same phase direction according to the corrective signal UP/DOWN. For example, when the status of the corrective signal UP/DOWN is "UP," the clock signal generator 164 increases the clock cycle of both of the clock signal CLK1 and the clock signal CLK2. Alternatively, when the status of the corrective signal UP/DOWN is "DOWN," the clock signal generator 164 reduces the clock cycle of both of the clock signal CLK1 and the clock signal CLK2. As a result, with repetitive operations, the clock signal CLK1 and the clock signal CLK2 can have a correct frequency and phase.

In various embodiments of the present disclosure, the loop filter module 140 is further configured to accumulate the error signal VE to generate an accumulated value ACC (not shown), and to compare the accumulated value ACC with the accumulated threshold value MACC. The loop filter module 140 can dynamically adjust the accumulated threshold value MACC, the phase threshold value MP, and the frequency threshold value MF according to the comparison result of the accumulated value ACC with the accumulated threshold value MACC.

Through such operation, the clock and data recovery circuit 100 can instantly adjust an update rate of the dock signal CLK1 and the clock signal CLK2 according to the offset level of the input data DATA. Thus, the impact of clock jitter can be reduced.

The following paragraphs provide certain embodiments related to the clock and data recovery circuit 100 to illustrate functions and applications thereof. However, the present disclosure is not limited to the following embodiments.

Figure 2:
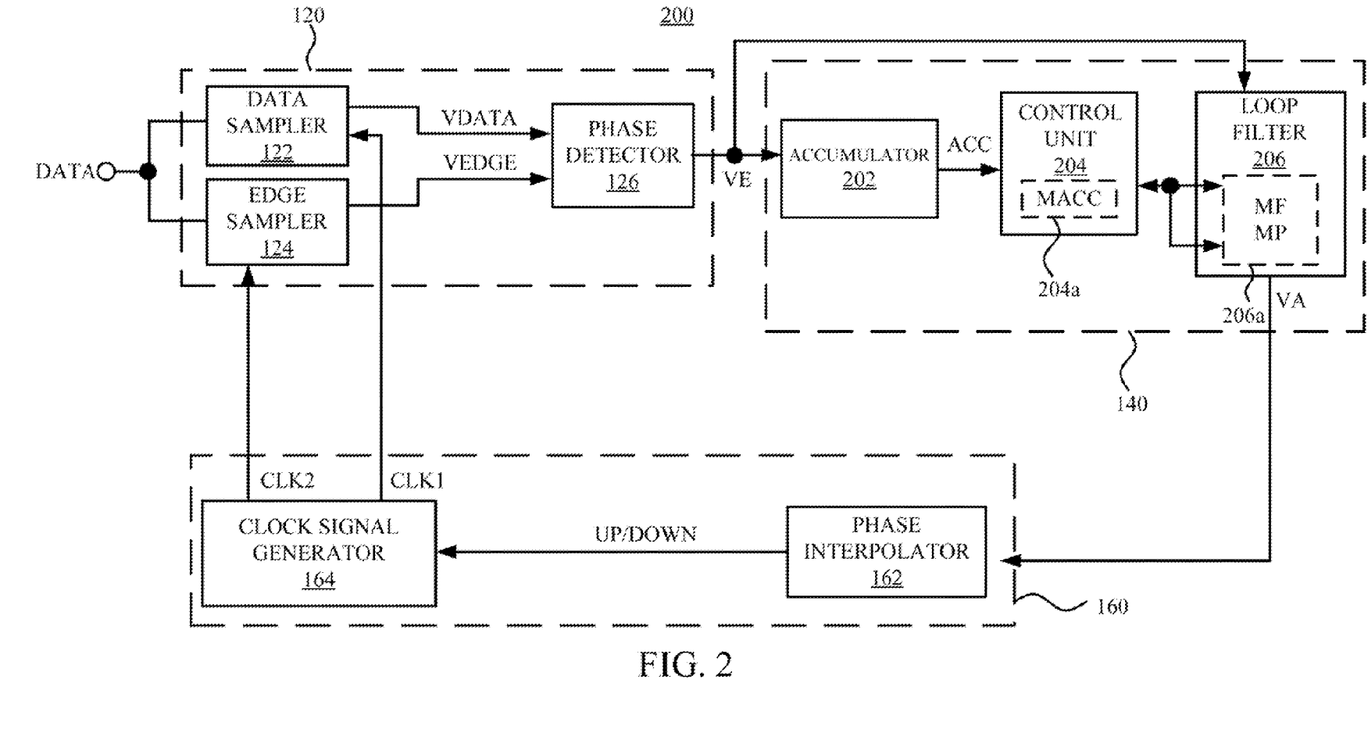
FIG. 2 is a schematic diagram of a clock and data recovery circuit according to one embodiment of the present disclosure.

Reference is made to FIG. 2. FIG. 2 is a schematic diagram of a clock and data recovery circuit 200 according to one embodiment of the present disclosure. Compared with the clock and data recovery circuit 100 shown in FIG. 1, the loop filter module 140 of the clock and data recovery circuit 200 of this embodiment includes an accumulator 202, a control unit 204, and a loop filter 206.

The accumulator 202 is configured to accumulate the error signal VE in a predetermined time interval to generate the accumulated value ACC. The control unit 204 is configured to compare the accumulated value ACC with the accumulated threshold value MACC, so as to adjust the accumulated threshold value MACC, the phase threshold value MP, and the frequency threshold value MF. The loop filter 206 is configured to compare the error signal VE with each of the phase threshold value MP and the accumulated threshold value MACC, so as to generate the corrective signal VA. In some embodiments, the accumulated threshold value MACC is initially stored in a register 204a of the control unit 204, and the phase threshold value MP and the frequency threshold value MF are stored in a register 206a of the loop filter 206.

It is noted that the phase detector 126 outputs the error signal VE having the value of 1 continuously when the accumulated value is increased during the predetermined time interval. In other words, the input data DATA is significantly shifted during the data transfer process, resulting in the phase difference between the data signal VDATA and the edge signal VEDGE being increased. At this time, the clock and data recovery circuit 200 is able to increase the bandwidth of the loop filter 206 by adjusting the phase threshold value MP and the frequency threshold value MF, and thus the update rate of the clock signal CLK1 and the clock signal CLK2 is increased. As a result, the efficiency of the clock and data recovery operation is increased, and the clock signal CLK1 and the clock signal CLK2 are able to be corrected quickly.

Alternatively, it is noted that the phase detector 126 outputs the error signal VE having the value of 0 continuously when the accumulated value is maintained at a specific value during the predetermined time interval. In other words, offset of the input data DATA is reduced during the data transfer process. At this time, the clock and data recovery circuit 200 is able to reduce the bandwidth of the loop filter 206 by adjusting the phase threshold value MP and the frequency threshold value MF. Thus, the update rate of the clock signal CLK1 and the clock signal CLK2 is reduced, and the impact of noise, e.g., clock jitter, is reduced.

Figure 3:
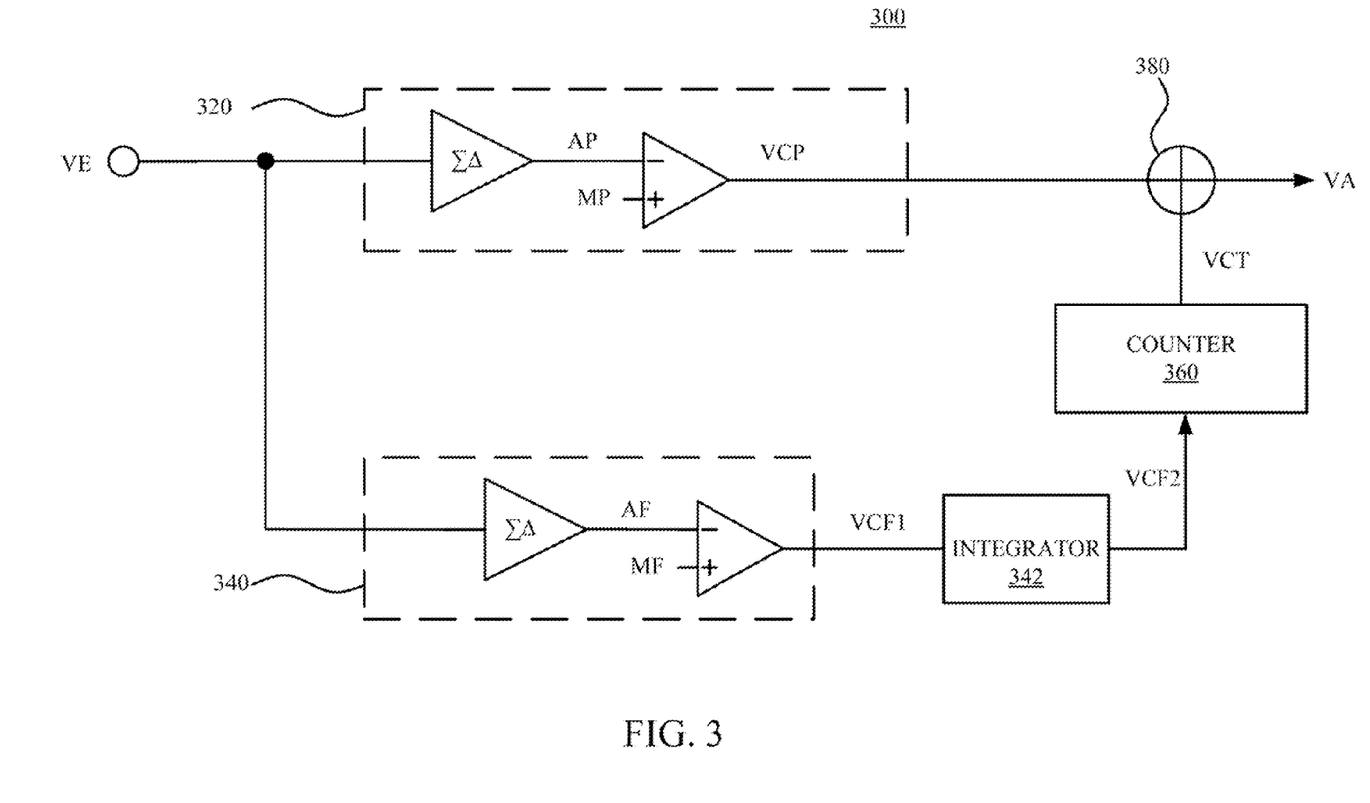
FIG. 3 is a schematic diagram of a loop filter according to one embodiment of the present disclosure.

Reference is made to FIG. 3. FIG. 3 is a schematic diagram of a loop filter 300 according to one embodiment of the present disclosure. As shown in FIG. 3, the loop filter 300 includes a sigma delta modulator 320, a sigma delta modulator 340, an integrator 342, a counter 360, and an adder 380.

The sigma delta modulator 320 is configured to accumulate the error signal VE to generate a phase accumulated value AP, and to compare the phase accumulated value AP with the phase threshold value MP. When the phase accumulated value AP is greater than the phase threshold value MP, the sigma delta modulator 320 outputs a control signal VCP.

The sigma delta modulator 340 is configured to accumulate the error signal VE to generate a frequency accumulated value AF, and to compare the frequency accumulated value AF with the frequency threshold value MF. When the frequency accumulated value AF is greater than the frequency threshold value MF, the sigma delta modulator 340 outputs a control signal VCF1. The integrator 342 is configured to accumulate the control signal VCF1 outputted from the sigma delta modulator 340, so as to generate an integral signal VCF2. The counter 360 is electrically coupled to the integrator 342 to receive the integral signal VCF2. The counter 360 can generate a control signal VCT according to the integral signal VCF2. The adder 380 is electrically coupled to the sigma delta modulator 320 and the counter 360 to receive the control signal VCP and the control signal VCT, and adds the control signal VCP and the control signal VCT to generate the corrective signal VA. Compared with the path for controlling phase (which includes the sigma delta modulator 320), the path for controlling frequency (which includes the sigma delta modulator 340, the counter 360, and the adder 380) is able to adjust the frequency threshold value MF much faster by using the operating method of the present disclosure. As a result, the frequency of the clock signal CLK1 and that of the clock signal CLK2 can have a much faster convergence rate. Operating details are described in the following embodiments.

Moreover, the control signal VCP, the control signal VCF1, the integral signal VCF2, and the control signal VCT may be multi-bit digital signals. When the frequency accumulated value AF is higher than the frequency threshold value MF, the sigma delta modulator 340 is able to switch the bit value of the control signal VCF1. Thus, the counter 360 starts counting to generate a different control signal VCT and transmit the same to the adder 380, and as a result, adjustments to the frequency of the clock signal CLK1 and that of the clock signal CLK2 are achieved. Alternatively, when the phase accumulated value AP is greater than the phase threshold value MP, the sigma delta modulator 320 is able to switch the bit value of the control signal VCP. Thus, the adder 380 outputs a different corrective signal VA accordingly, and as a result, adjustments to the phase of the clock signal CLK1 and that of the clock signal CLK2 are achieved. Therefore, the bandwidth of the loop filter 300 can be determined by the frequency threshold value MF and the phase threshold value MP. When the frequency threshold value MF and the phase threshold value MP are increased, the bandwidth of the loop filter 300 is reduced, resulting in a slower operating speed. Alternatively, when the frequency threshold value MF and the phase threshold value MP are reduced, the bandwidth of the loop filter 300 is increased, resulting in a faster operating speed.

The loop filter 300 is described for illustrative purposes only, and any type of loop filter able to perform the same operations can be utilized. Those skilled in the art are able to choose an appropriate loop filter according to practical applications.

Figure 4A:
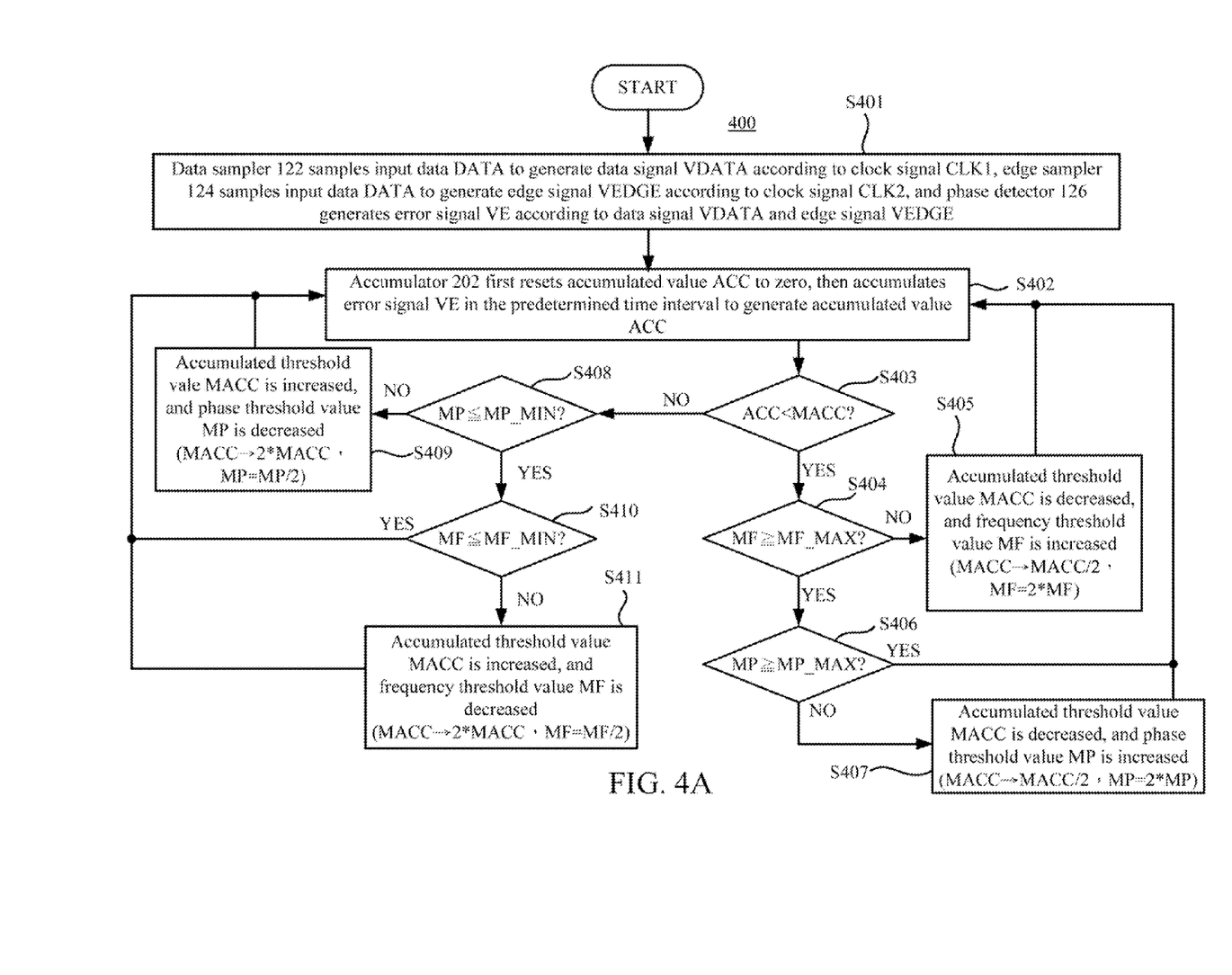
FIG. 4A is a flow chart of a clock and data recovery method according to one embodiment of the present disclosure.

Reference is made to FIG. 4A. FIG. 4A is a flow chart of a clock and data recovery method 400 according to one embodiment of the present disclosure. For simplicity, the operations of the clock and data recovery circuit 200 are described with the clock and data recovery method 400. As shown in FIG. 4A, the clock and data recovery method 400 includes step S401, step S402, step S403, step S404, step S405, step S406, step S407, step S408, step S409, step S410, and step S411.

In step S401, the data sampler 122 samples the input data DATA to generate the data signal VDATA according to the clock signal CLK1, the edge sampler 124 samples the input data DATA to generate the edge signal VEDGE according to the clock signal CLK2, and the phase detector 126 generates the error signal VE according to the data signal VDATA and the edge signal VEDGE.

In step S402, the accumulator 202 first resets the accumulated value ACC to zero, then accumulates the error signal VE in the predetermined time interval to generate the accumulated value ACC.

In step S403, the control unit 204 compares the accumulated value ACC with the accumulated threshold value MACC. If the accumulated value ACC is less than the accumulated threshold value MACC, step S404 is performed. Alternatively, if the accumulated value ACC is greater than the accumulated threshold value MACC, step S408 is performed.

In step S404, when the accumulated value ACC is less than the accumulated threshold value MACC, the control unit 204 further compares the frequency threshold value MF with a predetermined maximum frequency threshold value MF_MAX. If the frequency threshold value MF is less than the predetermined maximum frequency threshold value MF_MAX, step S405 is performed. Alternatively, if the frequency threshold value MF is greater than or equal to the predetermined maximum frequency threshold value MF_MAX, step S406 is performed.

In step S405, the control unit 204 decreases the accumulated threshold value MACC and increases the frequency threshold value MF, after which the process returns to the operation of step S402. For example, when the present accumulated value ACC is less than the predetermined accumulated threshold value MACC, this indicates that the offset of the input data is in the process of reducing. Thus, the clock and data recovery circuit 200 is able to increase the frequency threshold value MF, and the switching times of the control signal VCF are reduced. As a result, the update rate of the clock signal CLK1 and the clock signal CLK2 is reduced. At the same time, the clock and data recovery circuit 200 also decreases the accumulated threshold value MACC to avoid step S404 from being repeatedly triggered by the next accumulated value ACC.

In step S406, the control unit 204 compares the phase threshold value MP with a predetermined maximum phase threshold value MP_MAX. If the phase threshold value MP is less than the predetermined maximum phase threshold value MP_MAX, step S407 is performed. Alternatively, if the phase threshold value MP is greater than or equal to the predetermined maximum phase threshold value MP_MAX, step S402 is performed again.

In step S407, the control unit decreases the accumulated threshold value MACC and increases the phase threshold value MP, after which the process returns to the operation of step S402. In other words, when the offset of the input data DATA is in the process of reducing, the clock and data recovery circuit 200 adjusts the frequency threshold value MF toward the predetermined maximum frequency threshold value MF_MAX by performing step S405 and step S406 several times, and further performs step S407 to increase the phase threshold value MP. As a result, the switching times of the control signal VCP is reduced, and the update rate of the clock signal CLK1 and the clock signal CLK2 is thus reduced.

In step S408, the control unit 204 compares the phase threshold value MP with a predetermined minimum phase threshold value MP_MIN. If the phase threshold value MP is greater than the predetermined minimum phase threshold value MP_MIN, step S409 is performed. Alternatively, if the phase threshold value MP is less than or equal to the predetermined minimum phase threshold value MP_MIN, step S410 is performed.

In step S409, the control unit 204 increases the accumulated threshold vale MACC, and decreases the phase threshold value MP, after which the process returns to the operation of step S402. For example, when the present accumulated threshold value ACC is greater than the predetermined accumulated threshold value MACC, this indicates that the offset of the input data DATA is increased. Thus, the clock and data recovery circuit 200 is able to reduce the phase threshold value MP, and the switching times of the control signal VCP are increased. As a result, the update rate of the clock signal CLK1 and the clock signal CLK2 is increased, and the clock and data recovery circuit 200 can track the frequency more efficiently, so that more offsets can be calibrated. Similarly, the clock and data recovery circuit 200 also reduces the accumulated threshold value MACC to avoid step S409 from being repeatedly triggered by the next accumulated value ACC.

In step S410, after the phase threshold value MP is determined to be less than or equal to the predetermined minimum phase threshold value MP_MIN, the control unit 204 further compares the frequency threshold value MF with a predetermined minimum frequency threshold value MF_MIN. If the frequency threshold value MF is greater than the predetermined minimum frequency threshold value MF_MIN, step S411 is performed. Alternatively, if the frequency threshold value MF is less than or equal to the predetermined minimum frequency threshold value MF_MIN, step S402 is performed again.

In step S411, the control unit 204 increases the accumulated threshold value MACC and decreases the frequency threshold value MF. For example, when the offset of the input data DATA is increasing, the clock and data recovery circuit 200 adjusts the phase threshold value MP to the predetermined minimum phase threshold value MP_MIN. The clock and data recovery circuit 200 is able to perform step S411 to reduce the frequency threshold value MF for reducing the switching times of the control signal VCP. As a result, the update rate of each of the clock signal CLK1 and the clock signal CLK2 is increased, resulting in a tracking frequency with more efficiency.

It is noted that, in some embodiments, the predetermined minimum phase threshold value MP_MIN, the predetermined maximum phase threshold value MP_MAX, the predetermined minimum frequency threshold value MF_MIN, and the predetermined maximum frequency threshold value MF_MAX may be stored in the register 206a of the loop filter 206, and these parameters may be adjusted according to the requirements of practical applications.

Moreover, in some embodiments, various elements of the clock and data recovery circuit 200 can be implemented using all-digital circuits. For example, the control unit 204 and the method 400 can be implemented through a state machine. Therefore, the clock and data recovery circuit 200 has the advantages of easy design and low circuit variation. Alternatively, in some other embodiments, various elements of the clock and data recovery circuit 200 can be implemented through a combination of digital circuits and analog circuits, i.e., mixed signal circuits.

In addition, in some embodiments, the accumulated value MACC, the frequency threshold value MF and the phase threshold value MP can be multi-bit digital signals. Thus, the control unit 204 can adjust the accumulated value MACC, the frequency threshold value MF and the phase threshold value MP by shifting the bits of those parameters.

For example, in step S405 and step S407, the control units 204 can perform a right shift of one bit for each bit of the accumulated threshold value MACC, so as to reduce the accumulated threshold value MACC by half. Thus, the operation for decreasing the accumulated threshold value MACC is achieved. Alternatively, in step S409 and step S411, the control unit 204 can perform a left shift of one bit for each bit of the accumulated threshold value MACC, so as to double the accumulated threshold value MACC. Thus, the operation for increasing the accumulated threshold value MACC is achieved.

With similar operations, in step S405, the control unit 204 can double the frequency threshold value MF, or, in step S411, the control unit 204 can reduce the frequency threshold value MF by half. Similarly, in step S407, the control unit can double the phase threshold value MP, or, in step S409, the control unit 204 can reduce the phase threshold value MP by half.

However, the operations illustrated above are for illustrative purposes only. The operations of adjusting the accumulated value MACC, the frequency threshold value MF and the phase threshold value MP are not limited to multiples of two. Persons skilled in the art may adjust the adjustment multiple according to the requirements of practical applications.

Figure 4B:
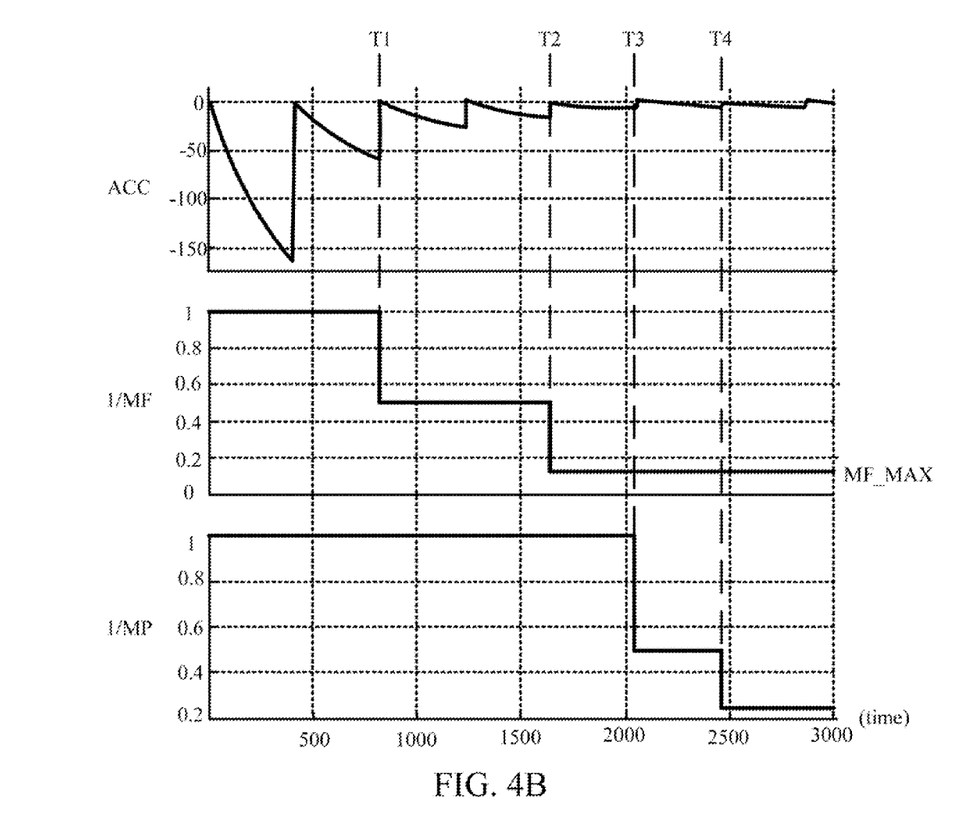
FIG. 4B illustrates partial operation waveforms of the clock and data recovery circuit shown in FIG. 2 according to one embodiment of the present disclosure.

Reference is made to FIG. 4B. FIG. 4B illustrates partial operation waveforms of the clock and data recovery circuit 200 shown in FIG. 2 according to one embodiment of the present disclosure. For example, if it is assumed that a frequency offset amount of 2000 parts per million (ppm) results during transfer of the input data DATA, the clock and data recovery circuit 200 starts performing a frequency tracking operation according to the input data DATA. Additionally, the accumulator starts accumulating the error signal VE to generate the accumulated ACC.

At time T1, the control unit 204 determines that the present accumulated value ACC is less than the accumulated threshold value MACC (not shown in FIG. 4B), and thus performs step S405 to double the frequency threshold value MF, and to reduce the accumulated threshold value MACC by half.

At time T2, the frequency tracking operation is almost completed, and the accumulated value ACC is becoming stable. At this time, since the accumulated value ACC is less than the accumulated threshold value MACC, the control unit 204 further doubles the frequency threshold value MF to reach the predetermined maximum frequency threshold value MF_MAX, and reduces the accumulated threshold value MACC by half.

At time T3, since the frequency threshold value MF is adjusted to the predetermined maximum frequency threshold value MF_MAX, the control unit 204 performs step S407 to double the phase threshold value MF. At time T4, since the accumulated value ACC is less than the accumulated threshold value MACC, the control unit 204 further doubles the phase threshold value MF to reach the predetermined maximum phase threshold value MP_MAX.

As shown in FIG. 4B, when the frequency tracking operation is completed, the phase threshold value MF and the frequency threshold value MP are immediately adjusted, and thus the operating speed of the clock and data recovery circuit 200 is correspondingly reduced. Through such operation, the impact of noise cause from clock jitter is improved, and the dynamic power consumption of the current operation is reduced.

Figure 5:
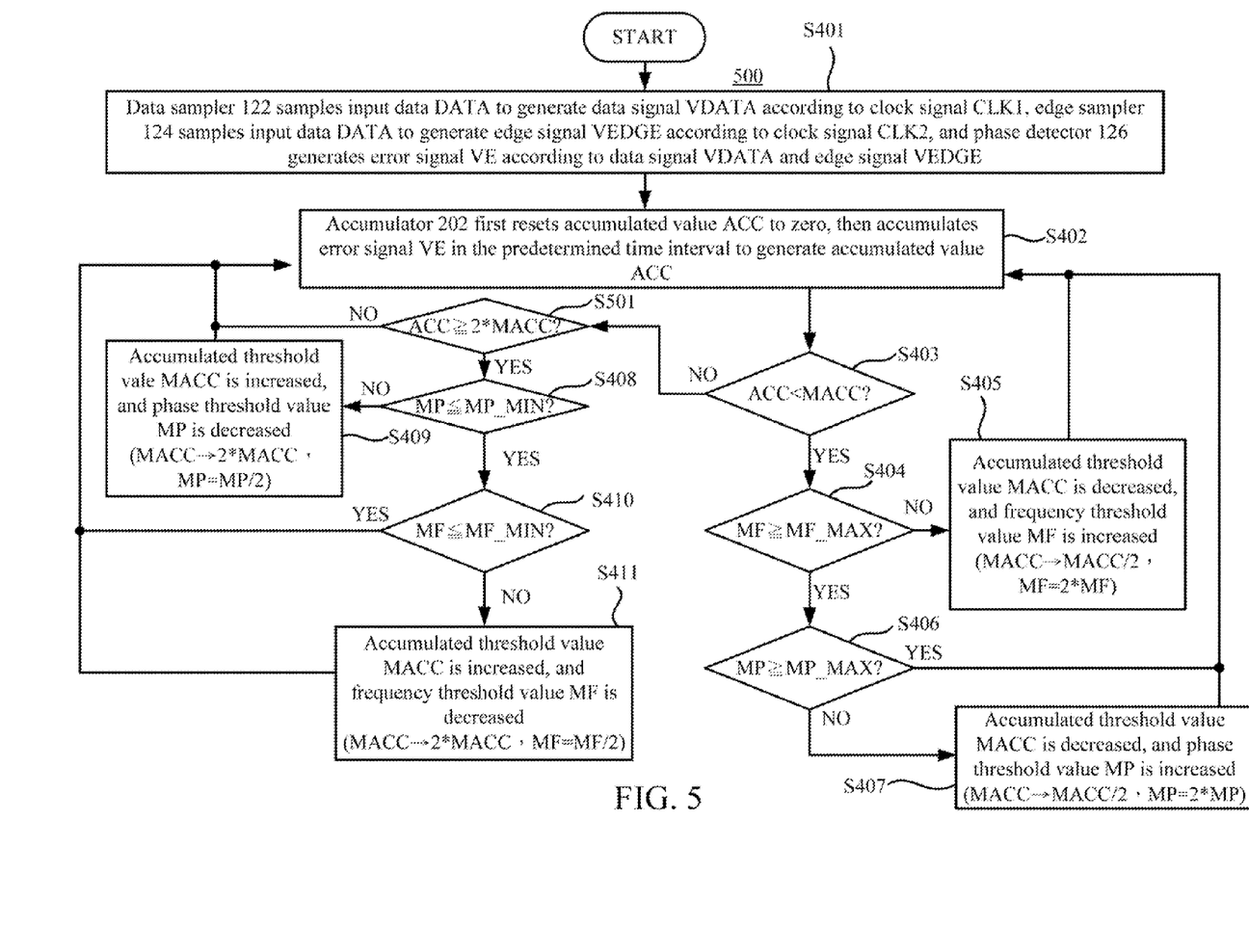
FIG. 5 is a flow chart of a clock and data recovery method according to one embodiment of the present disclosure.

Reference is made to FIG. 5. FIG. 5 is a flow chart of a clock and data recovery method 500 according to one embodiment of the present disclosure. Compared with the clock and data recovery method 400, the clock and data recovery method 500 further includes step S501. In this embodiment, if the accumulated value ACC is greater than the accumulated threshold value MACC after step S403 is performed by the control unit 204, step S501 will be performed.

In step S501, the control unit 204 compares the accumulated value ACC with two times the accumulated threshold value MACC. If the accumulated ACC is greater than or equal to two times the accumulated threshold value MACC, step S408 is performed. Otherwise, step S402 is performed.

In other words, in this embodiment, the control unit 204 determines that the offset of the input data DATA is too high to perform the following operations when the accumulated ACC is greater than or equal to two times the accumulated threshold value MACC. The above operation is for illustrative purposes only, and persons skilled in the art are able to adjust the limitation in step S501 according to practical applications to make the clock and data recovery circuit 200 have operations of adjusting bandwidth on different levels.

In summary, the clock and data recovery circuit and method thereof are able to dynamically adjust parameters of internal circuits according to the offset of the input data DATA. Thus, when the offset of the input data DATA is low, the operating speed of the clock and data recovery circuit 200 is reduced, so that the impact of clock jitter is reduced. Alternatively, when the offset of the input data DATA is increased, the operating speed of the clock and data recovery circuit 200 is immediately increased, and thus the speed of tracking frequency is increased.

It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A clock and data recovery circuit, comprising:
   a data analysis module configured to generate an error signal according to an input data, a first clock signal, and a second clock signal;
   a loop filter module configured to generate a first corrective signal according to the error signal, a phase threshold value, and a frequency threshold value; and
   a phase adjust module configured to generate the first clock signal and the second clock signal according to the first corrective signal,
   wherein the loop filter module is further configured to accumulate the error signal to generate an accumulated value, and to compare the accumulated value with an accumulated threshold value to dynamically adjust the accumulated threshold value, the phase threshold value, and the frequency threshold value.

2. The clock and data recovery circuit of claim 1, wherein the loop filter module comprises:
   an accumulator configured to accumulate the error signal in a predetermined time interval, so as to generate the accumulated value;
   a control unit configured to compare the accumulated value with the accumulated threshold value, so as to adjust the accumulated threshold value, the phase threshold value, and the frequency threshold value; and
   a loop filter configured to compare the error signal with the phase threshold value and the frequency threshold value, respectively, so as to generate the first corrective signal.

3. The clock and data recovery circuit of claim 2, wherein when the accumulated value is less than the accumulated threshold value, the control unit compares the frequency threshold value with a predetermined maximum frequency threshold value, and when the frequency threshold value is less than the predetermined maximum frequency threshold value, the control unit decreases the accumulated threshold value and increases the frequency threshold value.

4. The clock and data recovery circuit of claim 3, wherein when the frequency threshold value is less than the predetermined maximum frequency threshold value, the control unit reduces the accumulated threshold value by half and doubles the frequency threshold value.

5. The clock and data recovery circuit of claim 3, wherein when the frequency threshold value is greater than or equal to the predetermined frequency threshold value, the control unit further compares the phase threshold value with a predetermined maximum phase threshold value, and when the phase threshold value is less than the predetermined maximum phase threshold value, the control unit decreases the accumulated threshold value and increases the phase threshold value.

6. The clock and data recovery circuit of claim 5, wherein when the phase threshold value is less than the predetermined maximum phase threshold value, the control unit reduces the accumulated threshold value by half and doubles the phase threshold value.

7. The clock and data recovery circuit of claim 2, wherein when the accumulated value is greater than or equal to the accumulated threshold value, the control unit compares the phase threshold value with a predetermined minimum phase threshold value, and when the phase threshold value is greater than the predetermined minimum phase threshold value, the control unit increases the accumulated threshold value and decreases the phase threshold value.

8. The clock and data recovery circuit of claim 7, wherein when the accumulated value is greater than or equal to two times the accumulated threshold value, the control unit compares the phase threshold value and a predetermined minimum phase threshold value.

9. The clock and data recovery circuit of claim 7, wherein when the phase threshold value is greater than the predetermined minimum phase threshold value, the control unit doubles the accumulated threshold value and reduces the phase threshold value by half.

10. The clock and data recovery circuit of claim 7, wherein when the phase threshold value is less than or equal to the predetermined minimum phase threshold value, the control unit further compares the frequency threshold value with a predetermined minimum frequency threshold value, and when the frequency threshold value is greater than the predetermined minimum frequency threshold value, the control unit increases the accumulated threshold value and reduces the frequency threshold value.

11. The clock and data recovery circuit of claim 10, wherein when the frequency threshold value is greater than the predetermined minimum frequency threshold value, the control unit doubles the accumulated threshold value and reduces the frequency threshold value by half.

12. The clock and data recovery circuit of claim 2, wherein the loop filter module comprises:
   a first sigma delta modulator configured to accumulate the error signal to generate a phase accumulated value, and to output a first control signal when the phase accumulated value is greater than the phase accumulated value;
   a second sigma delta modulator configured to accumulate the error signal to generate a frequency accumulated value, and to output a second control signal when the frequency accumulated value is greater than the frequency threshold value;

an integrator configured to accumulate the second control signal to generate an integral signal;

a counter configured to accumulate the integral signal to generate a third control signal; and an adder configured to generate the first corrective signal according to the first control signal and the third control signal.

13. The clock and data recovery circuit of claim 1, wherein the data analysis module comprises:

a data sampler configured to sample a data value of the input data according to the first clock signal, so as to generate a data signal;

an edge sampler configured to sample a rising edge or a falling edge of the input data according to the second clock signal, so as to generate an edge signal, wherein the first clock signal and the second clock signal are different in phase by 90 degrees; and a phase detector configured to generate the error signal according to the data signal and the edge signal.

14. The clock and data recovery circuit of claim 1, wherein the phase adjust module comprises:

a phase interpolator configured to generate at least one second corrective signal according to the first corrective signal; and a clock signal generator configured to generate the first clock signal and the second clock signal according to the least one second corrective signal.

15. A clock and data recovery method, comprising:

sampling an input data according to a first clock signal by a data sampler to generate a data signal;

sampling the input data according to a second clock signal by an edge sampler to generate an edge signal, wherein the first clock signal and the second clock signal are different in phase by 90 degrees;

generating an error signal according to the data signal and the edge signal by a phase detector;

accumulating the error signal in a predetermined time interval by an accumulator to generate an accumulated value;

comparing the accumulated value with an accumulated threshold value to dynamically adjust the accumulated threshold value, a phase threshold value, and a frequency threshold value;

generating a corrective signal according to the error signal, the phase threshold value and the frequency threshold value by a loop filter; and adjusting the first clock signal and the second signal according to the corrective signal by a phase adjust module.

16. The clock and data recovery method of claim 15, wherein the step of adjusting the accumulated threshold value, the phase threshold value, and the frequency threshold value comprises:

comparing the frequency threshold value with a predetermined maximum frequency threshold value by the control unit when the accumulated value is less than the accumulated threshold value, and reducing the accumulated threshold value and increasing the predetermined maximum frequency threshold value by the control unit when the frequency threshold value is less than the predetermined maximum frequency threshold value.

17. The clock and data recovery method of claim 16, wherein the phase threshold value is compared with a predetermined maximum phase threshold value by the control unit when the frequency threshold value is greater than or equal to the predetermined maximum frequency threshold value, and the accumulated value is reduced and the phase threshold value is increased by the control unit when the phase threshold value is less than the predetermined maximum phase threshold value.

18. The clock and data recovery method of claim 16, wherein the step of adjusting the accumulated threshold value, the phase threshold value, and the frequency threshold value comprises:

comparing the phase threshold value with a predetermined minimum phase threshold value when the accumulated value is greater than or equal to the accumulated threshold value, and increasing the accumulated value and reducing the phase threshold value by the control unit when the phase threshold value is greater than the predetermined minimum phase threshold value.

19. The clock and data recovery method of claim 18, wherein the phase threshold value is compared with the predetermined minimum phase threshold value by the control unit when the accumulated value is greater than or equal to two times the accumulated threshold value.

20. The clock and data recovery method of claim 18, wherein the frequency threshold value is compared with a predetermined minimum frequency threshold value by the control unit when the phase threshold value is less than or equal to the predetermined minimum phase threshold value, and the accumulated threshold value is increased and the frequency threshold value is reduced by the control unit when the frequency threshold value is less than the predetermined minimum frequency threshold value.

* * * * *